United States Patent
Mahoney, III et al.

(10) Patent No.: US 7,564,165 B2
(45) Date of Patent: Jul. 21, 2009

(54) ACTUATING DEVICE HAVING AN INTEGRATED ELECTRONIC CONTROL CIRCUIT

(75) Inventors: William Paul Mahoney, III, Liberty, OH (US); Fernando Ray Tollens, Cincinnati, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 11/978,431

(22) Filed: Oct. 29, 2007

(65) Prior Publication Data

US 2009/0108707 A1 Apr. 30, 2009

(51) Int. Cl.
*H01L 41/09* (2006.01)
(52) U.S. Cl. ....................................... 310/317
(58) Field of Classification Search ................. 310/317, 310/318, 319, 314, 328; 239/102, 102.1, 239/102.2; *H01L 41/09*
See application file for complete search history.

(56) References Cited

U.S. PATENT DOCUMENTS 5,518,179 A * 5/1996 Humberstone et al. ... 239/102.2
6,825,591 B2 * 11/2004 Jansen et al. ................ 310/317

FOREIGN PATENT DOCUMENTS

GB 2412869 * 12/2005
WO WO 2005/097348 A1 10/2005

* cited by examiner

*Primary Examiner*—Quyen Leung
*Assistant Examiner*—Karen B Addison
(74) *Attorney, Agent, or Firm*—Amy I. Ahn-Roll

(57) ABSTRACT

An actuating device including a load and an integrated electronic control circuit comprising a microcontroller and at least one passive component. The microcontroller performs the dual function of providing a control signal to generate sufficient power to actuate a load and a drive signal to drive the load.

11 Claims, 1 Drawing Sheet

1

ACTUATING DEVICE HAVING AN INTEGRATED ELECTRONIC CONTROL CIRCUIT

FIELD OF THE INVENTION

The present invention relates to an actuating device having an integrated electronic control circuit. More specifically, the present invention relates to an actuating device having an integrated electronic control circuit for driving a load and controlling voltage to power a load.

BACKGROUND OF THE INVENTION

Actuating devices are well known in the art. Typical actuating devices drive a load or an actuator. An actuator is a device that converts electrical energy to mechanical energy. Exemplary actuating devices include devices for generating liquid droplets of active materials, such as air freshening systems, air treatment devices, nebulizers; and mechanically operated toys. To drive a load or actuator, an actuating device requires a sufficient amount of power. For example, an electromechanical actuator that generates liquid droplets of perfume materials in an air freshening system typically requires at least about 200 mA, at various voltages such as about 100 volts. To generate multiple voltages from a single variable voltage, air freshening systems, for example, often utilize a direct current to direct current (DC/DC) converter. Additionally, para-medical actuating devices such as nebulizers typically utilize DC/DC converters for its reliability in providing continuous operation. A DC/DC converter is a circuit which converts a source of direct current from one voltage level to another. DC/DC converters offer a method of generating multiple controlled voltages from a single variable battery voltage, thereby saving space instead of using multiple batteries to supply different parts of the device and, in turn, enable continuous operation of an actuating device. As such, DC/DC converters are commonly utilized in hand held or portable actuating devices. However, the cost of a DC/DC converter may be half of the retail price of a portable household actuating device, such as an air treatment or air freshening system, which makes its application in household actuating devices cost prohibitive. Thus, there remains a need for an electronic control circuit that is cost appropriate for portable household applications.

SUMMARY OF THE INVENTION

The present invention relates to an actuating device comprising an actuator and an integrated electronic control circuit that includes a microcontroller and at least one passive component in electrical communication with the microcontroller. The integrated electronic control circuit is operatively associated with the actuator and the microcontroller provides a control signal to one of said at least one passive component for controlling a voltage that powers the actuator and provides a drive signal to drive the actuator. In this way, the present invention allows an actuating device to operate the foregoing two tasks reliably with one less application specific integrated circuit (ASIC) than the prior art circuits having a DC/DC converter.

In one embodiment of the present invention, the actuating device may be an air freshening system having an electromechanical transducer that may generate droplets of liquid active materials such as perfumes, other volatile liquids and/ or volatile materials; and an integrated electronic drive circuit that includes a microcontroller and at least one passive component in electrical communication with the microcontroller for performing the dual functions of a controlling the voltage to power an electromechanical transducer, and providing the drive function that drives the electromechanical transducer.

The present invention also relates to a method of actuating a device comprising the steps of providing an actuator and an integrated electronic control circuit that includes a microcontroller and at least one passive component in electrical communication with the microcontroller; generating a drive signal from the microcontroller to drive the actuator; and generating a control signal from the microcontroller to control a voltage that powers the actuator

BRIEF DESCRIPTION OF THE DRAWINGS

While the specification concludes with the claims particularly pointing and distinctly claiming the invention, it is believed that the present invention will be better understood from the following description taken in conjunction with the accompanying drawings in which:

DETAILED DESCRIPTION OF THE INVENTION

Figure 1:
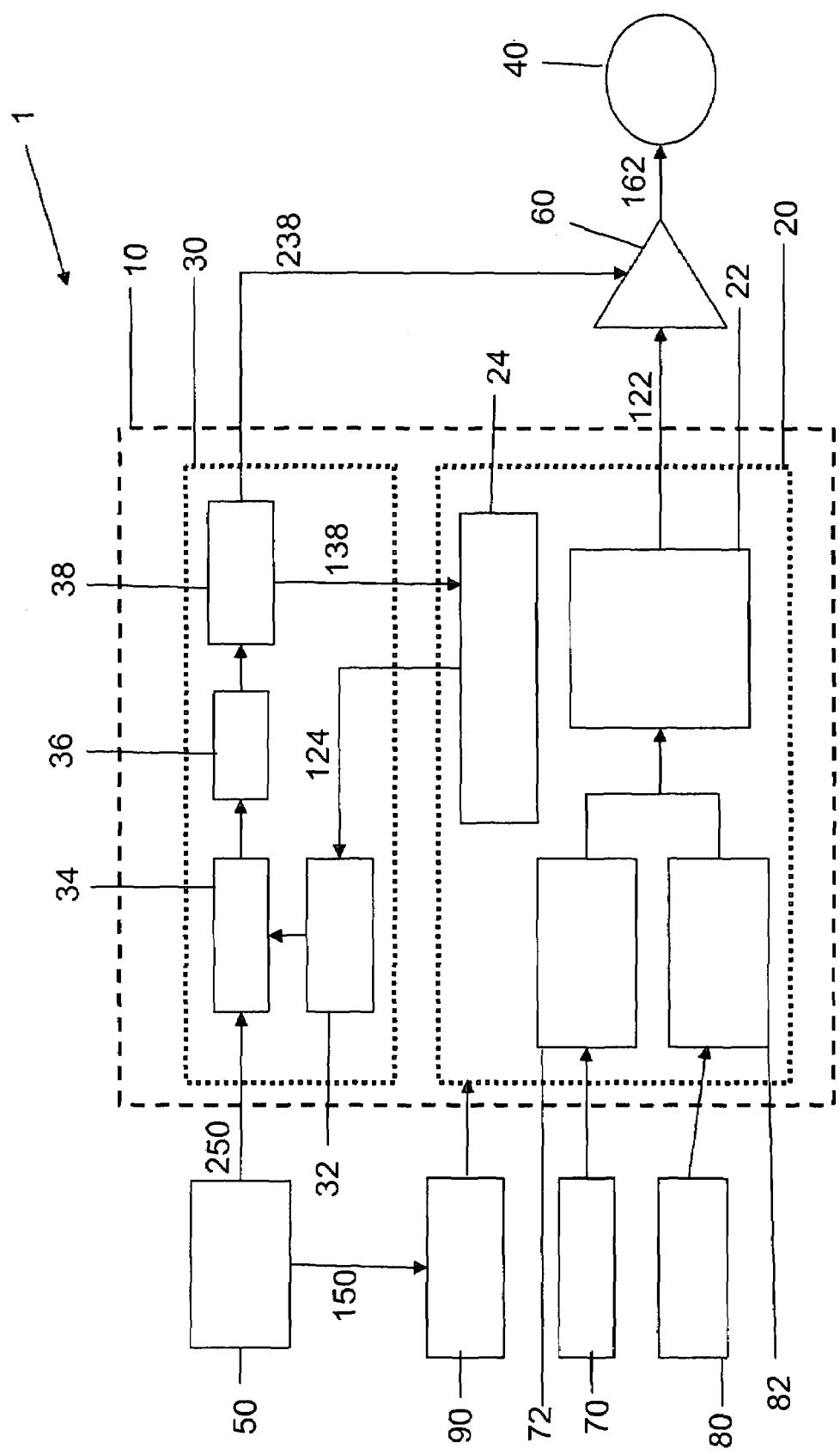
FIG. 1 is a block diagram of an exemplary electronic control circuit according to the present invention.

Referring to FIG. 1, the present invention comprises an integrated electronic control circuit 10, a power supply 50 that supplies power to the integrated electronic control circuit 10, an amplifier 60 that receives power from the integrated electronic control circuit 10 for powering a load 40. The load 40 may be part of the integrated electronic control circuit 10. An integrated electronic control circuit 1 is an electronic circuit that includes a microcontroller 20 and at least one passive component 30 in electrical communication with the microcontroller 20. An integrated electronic control circuit 1 includes a microcontroller 20 that is capable of sending an electrical signal to a passive component 30 and is also capable of receiving an electrical signal from a passive component 30. A passive component is an electrical building block that consumes energy but does not have an ASIC embedded therein. A DC/DC converter, for example, is not a passive component as it has an ASIC embedded therein such that sufficient power can be supplied to an actuating device. An electronic circuit consisting entirely of passive components is called a passive circuit and has the same properties as a passive component.

The microcontroller 20 may be programmed to provide the appropriate function for the desired circuit or alternatively, the microcontroller 20 may have a dedicated program embedded in ROM. The integrated electronic control circuit 10 according to the present invention may power an actuating device 1 without utilizing a DC/DC converter to control the voltage levels that are required to power a load 40. The microcontroller 20 according to the present invention is configured to perform both tasks of driving the load 40 and controlling a voltage to provide sufficient power to actuate the load 40, where both tasks can be performed more inexpensively than circuits using a DC/DC controller.

The present invention simplifies the electrical signals required to operate an actuating device 1, because the information for the drive signal 122 and the control signal 124 are generated from a common microcontroller 20, instead of a microcontroller requiring an input control signal from an electrical control circuit in which the microcontroller is not part of. Due to the integration of the microcontroller 20 with the passive elements 30, the microcontroller 20 responds when the drive signal generator 22 generates a drive signal 122 to the amplifier 60 and is capable of counting clock cycles to respond when power is required by a load 40. For purposes of illustrating the present invention in detail, the present invention will be described in an air freshening system for generating liquid droplets of perfume materials. The liquid material may be contained in a reservoir that is part of the device. The perfume materials may have a viscosity of about 3 to about 9 centipoise (cps), alternatively about 3 to about 5 cps, alternatively at least about 10 cps, and which have surface tensions below about 35 dynes per centimeter, alternatively in the range of from about 20 to about 30 dynes per centimeter. However, as stated above, those of ordinary skill in the art will understand that the present invention can be embodied in various actuating devices 1, and the invention is not limited to this specific execution. One of ordinary skill in the art will recognize that the benefits of the simplified construction of the present invention can be applied to any actuating device 1 according to the present invention to power a load 40.

More particularly, the actuating device 1 according to the present invention may be powered by a circuit having a transistor 32 in the feedback loop between the microcontroller 20 and the control signal 124. The microcontroller 20 can be used to count the number of times the control signal 124 is turned on and off during a set period. Furthermore, by charging the capacitor 38, and depleting it over a known period of time, the microcontroller 20 can be used to provide a discrete time period over which the control signal 124 is activated.

Power Supply

The exemplary integrated electronic control circuit 10 shown in FIG. 1 is driven by a power supply 50 which may be an AC or DC power supply 50 having a DC output. Suitable power supplies may include batteries and a standard wall outlet. The power supply 50 supplies a drive power signal 150 to the microcontroller 20 and a control power signal 250 to at least one passive component 30. The drive power signal 150 can optionally be provided first to an auxiliary power supply unit 90 before being provided to the microcontroller 20.

Drive Circuit

The power supply 50 may supply a drive power signal 150 to the microcontroller 20 which may include a drive signal generator 22. The microcontroller 20 may have an internal drive frequency generator 22 that is used to generate a square wave drive signal 122 with the frequency resolution required to drive the load 40. The drive signal generator 22 may be programmed with software that will perform the function of frequency generation which uses the number of microcontroller 20 clock cycles between output transitions to generate square waves that are required for driving the load 40. The frequency of oscillation is a factor that affects power supplied to a load 40. The load 40 may operate at its resonant drive frequency. Suitable actuators may provide resonant drive frequencies in a range of about 75 KHz to about 175 KHz, alternatively about 80 KHz to about 120 KHz, alternatively about 80 KHz to about 100 KHz, alternatively about 80 KHz. When driven at the resonant frequency, the power consumption of the load 40 increases relative to other frequencies at the same voltage. The resolution may be about 100 Hz to about 1 KHz, alternatively 500 Hz or 1 KHz, alternatively about 750 Hz to about 1 KHz, alternatively 1 KHz depending on the timing of the clock.

To determine the resonant frequency, the final control power 238 can be measured by turning off the control signal 124, and then driving the actuator for thirty cycles and turning the control signal 124 back on and measuring the time it takes to reach the target voltage in the capacitor 38. The frequency that takes the longest amount of time to charge the capacitor 38 to a predetermined amperage in a frequency sweep is the one that consumes the most power. The drive frequency generator 22 may select the operating frequency that places the highest load on the power supply 50 to be the resonant frequency. The resonant frequency may be is used in further operation to drive the load 40.

When the device 1 is switched on, the resonant frequency is unknown. Thus, before generating liquid droplets of perfume materials, all frequencies in the range may be tested as described above to find the operating frequency of the load 40. When operating, the resonant frequency may appear to shift, due to variation of circuit parameters with temperature, etc. Therefore, each time the device 1 generates liquid droplets, a single frequency point is measured. When all frequencies in the range have been measured, the operating frequency value is updated, and the process restarts.

Control Circuit

The power supply 50 may supply a control power signal 250 of about 0.8 to about 15 volts DC, alternatively about 1.5 to about 3 volts DC, at up to about 800 mA, alternatively from about 200 to about 300 mA, to at least one passive component 30 of the integrated electronic control circuit 10. In one embodiment, the passive component 30 that receives control power signal 250 from the battery is an inductor 34. The passive component 30 may have a relatively low quiescent power consumption when not under load, and its load current can be estimated by measuring the charge and discharge time of the capacitor 38 as described above.

The microcontroller 20 according to the present invention may contain all the functional blocks required to implement not only the drive signal 122 to drive the load 40, but also the control signal 124 to generate sufficient voltage to power the load 40. A suitable microcontroller 20 for the integrated electronic control circuit 10 is, for example, a device known by the trade names of Atmel ATTINY13, ATTINY26L, Atmel Mega168, and Sonix SN8P2501B. The microcontroller 20 may have fourteen pins with twelve 10.

In addition to generating a square wave at the resonant frequency to drive the load 40 as mentioned, the microcontroller 20 includes a control signal generator 24 that generates a control signal 124 to at least one passive component 30 for controlling the generation of voltage to supply the final control power 238 to the amplifier 60 to power the load 40. Passive components 30 may include a transistor 32, inductor 34, diode 36, capacitor 38, and resistor. The oscillation frequency of the control signal 124 is in a range to properly control the voltage necessary to power the load 40. In an air freshening system that uses a load 40 in the form of an about 10 nF piezoelectric element, the oscillation frequency of the control signal 124 is between about 200 KHz to about 1 MHz, alternatively, about 400 KHZ to about 750 KHz, alternatively about 450 KHz to about 600 KHz, alternatively about 500 KHz to about 550 KHz, alternatively about 500 KHz.

In one embodiment, the control signal 124 is supplied to a transistor 32. The transistor 32 is an N-Channel Field Effect Transistor or commonly called N Channel FET. The control signal 124 may be provided to the transistor 32 which may allow the inductor 34 to charge and discharge the diode 36 to the capacitor 38. In this way current is built up within the capacitor 38. The capacitor 38 may have a capacitance of about 22 uF to about 3300 uF, alternatively about 22 uF to about 2000 uF, alternatively about 47 uF to about 1000 uF, alternatively about 47 uF to about 100 uF, alternatively about 47 uF.

The microcontroller 20 may monitor the voltage being charged to the capacitor 38 and determines if the capacitor 28 has achieved its target voltage level by receiving a feedback control signal 138 from the capacitor 38. Upon reaching the target voltage the control signal 124 is turned off. The passage of the control signal 124 from the microcontroller 20 through the passive components 30 and back to the microcontroller 20 is called a voltage feedback loop. When the voltage level of the capacitor 38 drops below that of the target voltage, due to the fact that it supplies final control power 238 to the amplifier 60, the control signal 124 may once again turned back on. The final control power 238 may be about 3 to about 10 volts, alternatively about 4 to about 9 volts, alternatively about 5 to about 8, alternatively about 6 to about 7 volts; and about 1 to 1000 mA, alternatively about 100 mA to about 900 mA, alternatively about 100 to about 800 mA, alternatively about 200 mA to about 700 mA, about 200 mA to about 400 mA, alternatively about 200 mA to about 300 mA.

The control circuit discussed herein can be practiced within the operation time of the drive circuit discussed above. Specifically, there is downtime during the generation of the drive signal 122, where the microcontroller 20 is counting clock cycles. This downtime can be used to monitor the output voltage using the above described feedback loop which is already in the circuit of the microcontroller 20 to determine if the voltage level is above or below a predetermined point. Depending on the voltage determination, the microcontroller 20 could then turn on or off the control signal 124. In addition, the ability to keep track of off-time adds to the ability to control the duty cycle of the control signal 124, within the same microcontroller 20, and may increase battery life, thereby increasing the length of time over which the required power is withdrawn. The off time of the control signal 124 may increased to help prolong battery life and this may be done through the duty cycle of the control signal 124. The lowest duty cycle that will allow the control signal 124 to turn on and off may be generally preferred. When the current duty cycle will not longer allow the control signal 124 to turn off, the duty cycle is increased. Off time is the time where the microcontroller 20 is not generating the wave function of the control signal 124 and is only generating the wave function of the drive signal 122.

Amplifier and Load

The air freshening system may have a power amplifier 60 and a load 40 in the form of an actuator. A power amplifier 60 amplifies the power 238 supplied by the passive component 30 and upon receiving the drive signal 122 from the microprocessor 20, the amplifier 60 sends the final power 260 to the actuator. Suitable actuators may include electromechanical transducers such as piezoelectric elements or piezoelectric crystals and solenoids. In an air freshening system, the actuator may be a round piezoelectric crystal having an optional orifice therethrough. The piezoelectric crystal may be mounted on a substrate having a perforate membrane from which liquid droplets of perfume materials are emitted. The piezoelectric crystals may also be physically de-coupled from the perforate membrane. In both configurations, the piezoelectric crystal may be in fluid communication with the liquid and operatively associated with the perforate membrane such that liquid droplets of perfume material passes through the perforate membrane for diffusion into the atmosphere. The diameter of the perforations may be less than about 30 microns, alternatively less than about 15 microns, alternatively, between about 2 to about 10 microns, alternatively between about 4 to about 8 microns, alternatively between about 5 to about 7 microns.

In this embodiment, the circuit of the amplifier 60 may be configured as a bridge circuit, which may be a resonant bridge circuit. The actuator forms part of the bridge circuit. The drive signal generator 22 may generate a drive signal 122 which may be comprised of two signals 180 degrees out of phase at a desired frequency. The two signals may comprise non-overlapping signals. Operating from about 3 to about 6 volts, alternatively about 5 volts, the microcontroller 20 can generate a drive signal 122 to the amplifier 60 which amplifies the voltage to supply a final power 260 to the actuator in the order of about 32 to about 55 volts peak-to-peak, alternatively about 42 to about 55 volts peak to peak. The final power 260 supplied to the actuator is in the range of about 0.7 watts to about 1.7 watts.

Modes

The device 1 may have two operating modes, a maintenance mode and a boost mode. The maintenance mode is the default mode which occurs when the device 1 is turned on. The boost mode may be a user activated mode as desired to increase operation of the actuator. In an air-freshener of this type that sprays fluid in two different modes, the integrated electronic control circuit 10 includes a maintenance switch 70 and a boost switch 80. The maintenance switch 70 may be connected to the microcontroller 20 to control a timer 72 provided by the microcontroller 20 to set the interval at which the drive signal is provided to the power amplifier 60 to control the interval at which the droplet generator is automatically operated.

The microcontroller 20 may also provide a boost timer 82 to generate the drive signal 122, on demand, as a pulse over a predetermined period longer than the pulse at which the load 40 is automatically operated. The boost timer 82 can be operated by a mono-stable boost switch 80 connected to the microcontroller 20.

A maintenance mode is provided wherein a preset quantity of fluid is emitted by the actuator at intervals determined by a user. This is achieved by automatically actuating the actuator for a predetermined length of time, a maintenance switch 70 allowing the user to control how often the actuator emits fluid. The maintenance switch 70 may be a multi-position slide switch that the user may adjust to set the time interval between sprays.

The maintenance timer 72 may be used to set the time interval between the maintenance sprays as mentioned above. It also sets the time duration of each spray. The maintenance timer 72 can be provided by software or hardware on the microcontroller 20. The maintenance switch 70 may be connected to the maintenance timer 72 to allow the user to set the interval between each background spray.

In one embodiment of the present invention, the maintenance mode includes a spray period in which the actuator is generating liquid droplets of perfume from the air freshening system and a rest period in which the actuator is not emitting liquid droplets of perfume from the air freshening system. The spray period may be between about 5 milliseconds and about 5 seconds, alternatively between about 10 milliseconds and 1 second, alternatively between about 20 milliseconds and 500 milliseconds, alternatively between about 50 milliseconds and 100 milliseconds. The rest period may be between about 1 second and about 30 hours, alternatively between about 1 second and about 24 hours, alternatively, between about 5 seconds and 12 hours, alternatively between about 5 seconds and about 8 hours, alternatively between about 5 seconds and about 6 hours, alternatively between about 5 seconds and about 4 hours, alternatively between about 5 seconds and about 3 hours, alternatively between about 5 seconds and about 2 hours, alternatively between about 5 seconds and about 1 hour, alternatively between about 5 seconds and about 45 minutes, alternatively between about 5 seconds and 30 minutes, alternatively between about 5 seconds and about 20 minutes, alternatively between about 5 seconds and about 15 minutes, alternatively between about 5 seconds and about 10 minutes, alternatively between about 5 seconds and about 5 minutes, alternatively between about 5 seconds and about 150 seconds, alternatively between about 20 seconds and about 120 seconds, alternatively between about 25 seconds and about 80 seconds, alternatively between about 10 seconds and about 40 seconds. It is understood, however, that periods of time longer than the above ranges of time may be utilized with the present invention.

A boost mode can also be provided. In this mode, when the user operates boost switch 80, the actuator sprays a preset quantity of fluid. A boost timer 82 can be provided as hardware or software in the microcontroller 20. When the boost switch 14 is pressed, the software executes the boost spray. Activating the boost mode may split the time period additional fluid is to be sprayed into a number of quanta of fixed duration, with a fixed time interval between each quanta. Each quantum may be 1 second, which may be repeated 10 times with a 40 ms time gap between each 60 ms pulse. The 40 ms gap may lower the average flow rate and gives the actuator time to recover between each spray.

Typically, the boost mode may emit about 1 mg to about 3 mg of perfume per 3 seconds whereas the maintenance mode emits about 40 mg of perfume per hour during cycle that includes a spray for about 60 milliseconds about every 1 to 60 seconds, alternatively about 5 to about 60 seconds. The microcontroller is programmed to control the 500 KHz signal such that sufficient energy is stored in the capacitor 38 for carrying out a boost cycle for at pre-programmed time or until the perfume is depleted from the device. In one embodiment, the boost mode is at least about 1 second, alternatively at least about 3 seconds, alternatively between about 1 second and about 10 seconds, alternatively between about 3 seconds and about 5 seconds, alternatively about 3 seconds.

A problem addressed by use of the boost function may be the deleterious influence on device performance of a static layer of fluid which, in some circumstance may develop over time on the top surface of the load 40. On some devices it appears that the load 40 has difficulty producing droplets through this film of fluid. It was noticed that the initiation of spraying can move the fluid film away from the spraying area. Thus it was determined that a load 40 suffering from this problem could be cleared by subjecting it to successive initiation operations.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

All documents cited in the Detailed Description of the Invention are, in relevant part, incorporated herein by reference; the citation of any document is not to be construed as an admission that it is prior art with respect to the present invention. To the extent that any meaning or definition of a term in this written document conflicts with any meaning or definition of the term in a document incorporated by reference, the meaning or definition assigned to the term in this written document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An actuating device comprising:
   a. a load; and
   b. an integrated electronic control circuit comprising a microcontroller and at least one passive component in electrical communication with said microcontroller, said integrated electronic control circuit is operatively associated with said load,
   wherein a power supply supplies a voltage to said at least one passive component to power said load and wherein said microcontroller comprises (i) a control signal generator for generating a control signal to one of said at least one passive component for controlling said voltage that powers said load without utilizing a DC/DC converter and (ii) a drive signal generator for generating a drive signal to drive said load.

2. The actuating device of claim 1, wherein said actuating device is an air freshening system.

3. The actuating device of claim 2, wherein said air freshening system comprises a liquid active material, said liquid active material is selected from the group consisting of perfumes, fragrances, insecticides, and mixtures thereof.

4. The actuating device of claim 1, wherein said load comprises a piezoelectric element.

5. The actuating device of claim 1, wherein said microcontroller receives said control signal from said at least one passive component to complete a control feedback loop that controls said voltage that powers said load.

6. The actuating device of claim 1, wherein said control signal is about 500 KHz.

7. The actuating device of claim 1, wherein said at least one passive component is selected from the group consisting of a transistor, inductor, diode, capacitor, resistor, or combinations thereof.

8. The actuating device of claim 1, wherein said actuating device further comprises a maintenance switch connected to said microcontroller, and said microcontroller comprises a maintenance timer electrically associated with said maintenance switch to set a maintenance interval during which a maintenance drive signal is provided to control said maintenance interval during which said actuating device is operated.

9. The actuating device of claim 1, wherein said actuating device further comprises a boost switch connected to said microcontroller, and said microcontroller further comprises a boost timer electrically associated with said boost switch to set a boost interval during which a boost drive signal is provided to control said boost interval when said boost switch is activated.

10. An air freshening system comprising:
   a. a reservoir for containing a liquid;
   b. an electromechanical transducer in fluid communication with the liquid when present in said reservoir; and
   c. an integrated electronic control circuit comprising a microcontroller and at least one passive component in electrical communication with said microcontroller, said integrated electronic control circuit is operatively associated with said electromechanical transducer,
   wherein a power supply supplies a voltage of about 0.8 volts to about 15 volts DC, at about 200 to about 300 mA, to said at least one passive component to power said electromechanical transducer, and wherein said microcontroller provides (i) a control signal to one of said at least one passive component for controlling said voltage that powers said electromechanical transducer without utilizing a DC/DC converter, and a drive signal (ii) to drive said electromechanical transducer.

11. A method of actuating a device comprising:
a. providing an integrated electronic control circuit comprising a microcontroller and at least one passive component in electrical communication with said microcontroller, said integrated electronic control circuit is operatively associated with an actuator;
b. supplying a voltage to said at least one passive component;
c. generating a drive signal from said microcontroller for driving said actuator; and
d. generating a control signal from said microcontroller to said at least one passive component for controlling said voltage that powers said actuator without utilizing a DC/DC converter.

* * * * *